United States Patent [19]

Inoue

[11] Patent Number: 5,235,210
[45] Date of Patent: Aug. 10, 1993

[54] FIELD EFFECT TRANSISTOR

[75] Inventor: Kazuhiko Inoue, Kawasaki, Japan

[73] Assignee: Kabushiki Kaisha Toshiba, Kawasaki, Japan

[21] Appl. No.: 504,069

[22] Filed: Jan. 23, 1989

Related U.S. Application Data

[63] Continuation of Ser. No. 113,437, Oct. 28, 1987, abandoned, which is a continuation of Ser. No. 843,801, Mar. 27, 1986, abandoned, which is a continuation of Ser. No. 638,858, Aug. 8, 1984, abandoned.

[30] Foreign Application Priority Data

Aug. 24, 1983 [JP] Japan ................. 58-153167

[51] Int. Cl.⁵ ............................................. H01L 23/48
[52] U.S. Cl. ..................... 257/740; 257/279; 257/281; 257/289; 257/769; 257/773
[58] Field of Search .................. 357/15, 22, 55; 257/279, 281, 289, 740, 769, 773

[56] References Cited

U.S. PATENT DOCUMENTS

| | | | |
|---|---|---|---|
| 4,310,570 | 1/1982 | Calviello | 357/22 |
| 4,375,643 | 3/1983 | Yeh et al. | 357/22 |
| 4,393,578 | 7/1983 | Cady et al. | 357/22 |
| 4,397,075 | 9/1983 | Fatula et al. | 357/55 |

FOREIGN PATENT DOCUMENTS 58-53516 11/1983 Japan.

OTHER PUBLICATIONS

Translation of the portion of Japanese Patent (Kokoku) No. 58-53516 describing FIGS. 2 to 4.

Primary Examiner—Edward Wojciechowicz
Attorney, Agent, or Firm—Finnegan, Henderson, Farabow, Garrett & Dunner

[57] ABSTRACT

An SB FET comprising source and drain regions formed in the surface of a gallium arsenide (GaAs) substrate, and a channel region formed between the source and drain regions. The gate electrode of the SB FET is formed on the channel region in Schottky contact therewith. The SB FET further comprises source and drain electrodes which are mounted on the source and drain regions in ohmic contact therewith, while being separated from each other at a greater distance than the length of the channel region.

4 Claims, 2 Drawing Sheets

F I G. 4A
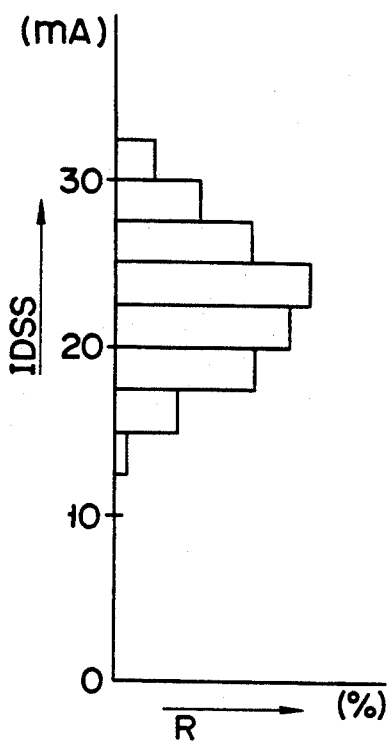
F I G. 4B
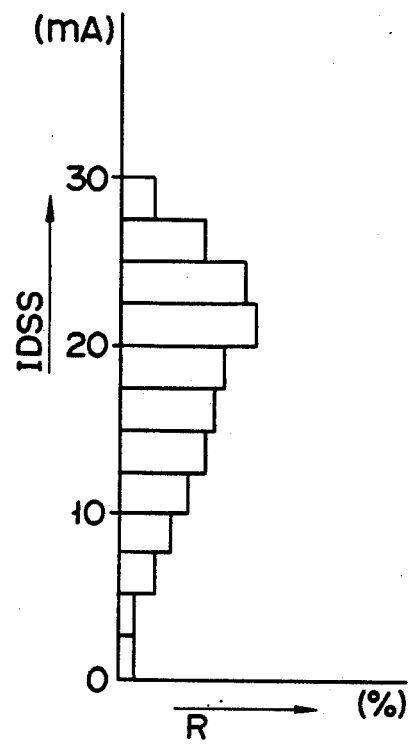
F I G. 5
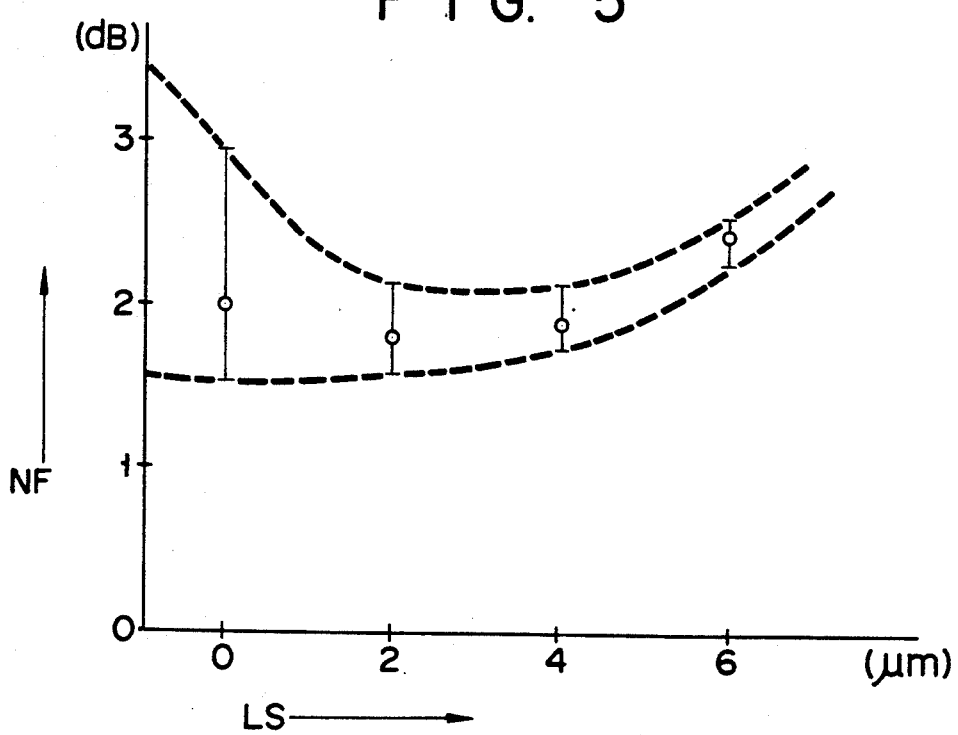

FIELD EFFECT TRANSISTOR

This application is a continuation of application Ser. No. 07/113,437, filed Oct. 28, 1987, now abandoned, which is a continuation of application Ser. No. 843,801, filed Mar. 27, 1986 which is a continuation of Ser. No. 638,858, filed Aug. 8, 1984, now abandoned.

BACKGROUND OF THE INVENTION

This invention relates to a field effect transistor and, more particularly, to a Schottky barrier field effect transistor (SB FET) for high frequency application. This SB FET is also called "metal semiconductor field effect transistor (MES FET)".

A high frequency Schottky barrier FET is formed on a semiinsulator substrate allowing for a great mobility, for example, a substrate prepared from gallium arsenide (GaAs). A mobility of a GaAs substrate is several times greater than that of a silicon substrate. Already known is a GaAs SB FET having the following construction. This GaAs SB FET comprises source and drain regions which contain a high impurity concentration and formed in the surface area of the GaAs substrate and a channel region which contains a low impurity concentration and formed in a space defined between the source and drain regions. The GaAs SB FET is further provided with a gate electrode formed in Schottky contact with the channel region and also with source and drain electrodes formed in ohmic contact with the source and drain regions respectively. These source and drain electrodes are disposed on the corresponding source and drain regions at an interval equal to the length of the channel region. The source and drain electrodes respectively have a 2-ply structure constructed by mounting a platinum layer on a layer of gold-germanium alloy. The gate electrode is formed on a channel region between the source and drain electrodes.

The above-mentioned GaAs SB FET has the drawbacks that the product has noticeable variation in its various characteristics such as the gain in the high frequency band and noise factor, withstand voltage previously between the source and drain, and an extremely low yield. In other words, the GaAs SB FET constructed as described above has been found unadaptable for volume production because of low reproducibility.

SUMMARY OF THE INVENTION

It is accordingly the object of this invention to provide a Schottky barrier FET transistor which can be manufactured in volume without the deterioration of the quality.

To attain the above-mentioned object, this invention provides a Schottky barrier field effect transistor which comprises:
a semiinsulator substrate;
impurity-bearing source and drain regions formed in the surface area of said semiinsulator substrate;
a channel region formed between and in contact with the source and drain regions with a lower concentration of impurity than said source and drain regions;
source and drain electrodes formed in ohmic contact with said source and drain regions which being separated from each other at a greater distance than the length of said channel region; and
a gate electrode formed in Schottky contact with said channel region.

BRIEF DESCRIPTION OF THE DRAWINGS

FIG. 4A shows the distribution of saturated drain currents of a large number of the Schottky barrier FETs of FIG. 2 which are manufactured through the same process;

FIG. 4B shows the distribution of saturated drain currents of the conventional Schottky barrier FETs which are manufactured through the same process; and FIG. 5 illustrates the relationship between the distance from the gate electrode to the source electrode and the noise factor.

DETAILED DESCRIPTION OF THE PREFERRED EMBODIMENT

Figure 1:
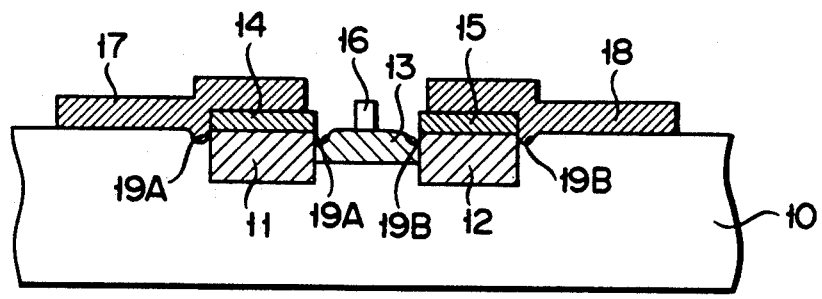
FIG. 1 is an illustration indicating the structural defects of the conventional Schottky barrier FET improved by the present inventor.

The structural defects of the conventional GaAs SB FET have been defined by the actual investigation of the steps of manufacturing the product and its quality. Referring to FIG. 1, grooves 19A, 19B are formed in the substrate 10 and channel region 13 around the periphery of the source and drain electrodes 14, 15. The grooves 19A, 19B are readily produced with noticeable variations in the depth when the source and drain electrodes 14, 15 are mounted on the corresponding source and drain regions 11, 12 and also when the photo resist used in etching is later chemically processed.

The quality of a noninsulation gate type element such as a GaAs SB FET is noticeably affected by parasitic resistance as a rule. For instance, when the groove 19A of FIG. 1 is formed, the saturated drain current IDSS decreases, and a parasitic resistance increases between the source region 11 and gate electrode 16, leading to a decline in the transconductance $g_m$ of the SB FET. The deterioration of gains and noise factors in the high frequency range are directly affected by drops in the saturated drain current IDSS and the above-mentioned transconductance $g_m$ of the SB FET. It was proven that when the groove 19B was produced, a drop in the withstand voltage between the source and drain regions occurred. Further, the channel region 13 is made shallower than the source and drain regions 11, 12 and contains a higher concentration of impurity toward the surface. The sizes of the grooves 19A, 19B appreciably affect variations in the magnitude of parasitic resistance in the channel region 13.

Figure 2:
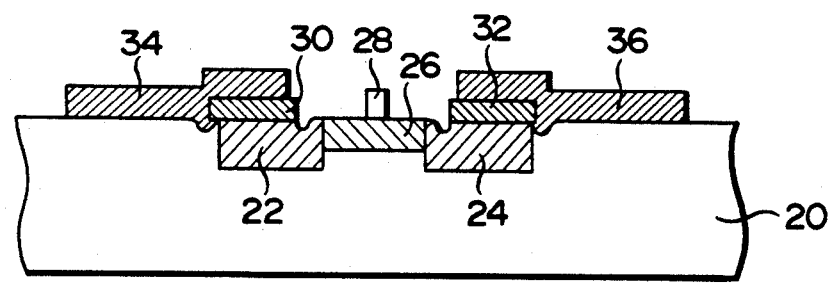
FIG. 2 is a cross sectional view of a GaAs Schottky barrier FET embodying this invention.

A description may now be made, with reference to FIG. 2, of a GaAs SB FET embodying this invention. This SB FET comprises a semiinsulator substrate 20 prepared from gallium arsenide, source and drain regions 22, 24 formed in the surface area of the substrate 20, and a channel region 26 formed between the source and drain regions in contact therewith. The source and drain regions 22, 24 are formed with a depth of 0.3 microns and have an impurity concentration of $8 \times 10^{17}$ cm$^3$. The channel region 26 is formed with a depth of 0.2 microns and had an impurity concentration of $1 \times 10^{17}$/cm$^3$, and extends for a length of 6 microns between the source and drain regions 22, 24. The SB FET of this invention further comprises a gate electrode 28 formed on the channel region 26 is Schottky contact therewith, and source and drain electrodes 30, 32 which are respectively formed on the source and drain regions 22, 24 in ohmic contact therewith at a prescribed distance ranging between 2 and 5 microns, for example, 2.5 microns. The SB FET is also provided with bonding pads 34, 36 mounted on the substrate 20 in contact with the source and drain electrodes 30, 32.

Figure 3A:
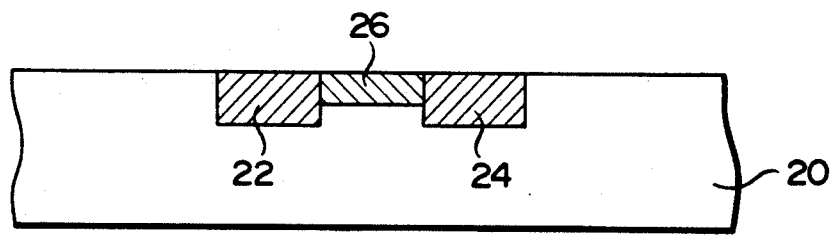
FIGS. 3A and 3B show the steps of manufacturing the GaAS Schottky barrier FET of FIG. 2.

A description may now be made of the sequential steps of manufacturing the subject GaAs SB FET. An n-type impurity is implanted in the first and second prescribed spots on the surface of the substrate 20 with a dosage of $3 \times 10^{13}/cm^2$ by an energy of 200 KeV. Further, the same kind of n-type impurity is implanted in the third prescribed spot between the first and second prescribed spots with a dosage of $3 \times 10^{12}/cm^2$ by an energy of 100 KeV. After the above-mentioned ion implantation, the substrate 20 undergoes heat treatment at a temperature of 850° C. for 15 minutes in an atmosphere of argon. This heat treatment causes the source region 22, drain region 24 and channel region 26, respectively formed with the aforementioned impurity concentration and depth, to occupy the first to the third prescribed spots as shown in FIG. 3A.

Thereafter, a layer of silicon dioxide ($SiO_2$) is deposited by the CVD process on the substrate 20 and the above-mentioned three regions 22, 24, 26 with a thickness of 5,000 Å in an atmosphere of monosilane gas ($SiH_4$). A resist pattern is impressed on the $SiO_2$ layer. The $SiO_2$ film is etched with this resist pattern used as a mask to expose those portions of the $SiO_2$ layer which are deposited on the source and drain regions. With the foregoing embodiment, the resist pattern masks those portions of the $SiO_2$ layer which are mounted on the source and drain regions to an extent which measures 2 microns beyond the channel region 26. After the exposure of the $SiO_2$ layer, a gold-germanium (Au-Ge) alloy layer (weight ratio Au:Ge=88:12) is formed on the resist pattern and the source and drain regions 22, 24 with a thickness of 2,000 Å by vacuum deposition. Further, a platinum (Pt) layer is mounted on said Au-Ge alloy layer with a thickness of 300 Å. Later, when the resist pattern is dissolved by an organic solvent, the unnecessary portions of the Au-Ge alloy layer and Pt layer deposited on the resist pattern are removed. Heat treatment is applied to those portions of said Au-Ge alloy layer and Pt layer, retained on the source and drain regions 22, 24, at a temperature of 400° C. for 5 minutes in an atmosphere of nitrogen ($N_2$). This heat treatment causes the Au-Ge alloy layer to be alloyed with the GaAs substrate 20 to provide the source and drain electrodes 30, 32 shown in FIG. 3B. After the source and drain electrodes 30, 32, are formed by the so-called lift-off process, the unnecessary $SiO_2$ layer is etched from the substrate by means of a solution of ammonium fluoride ($NH_4F$).

Figure 3B:
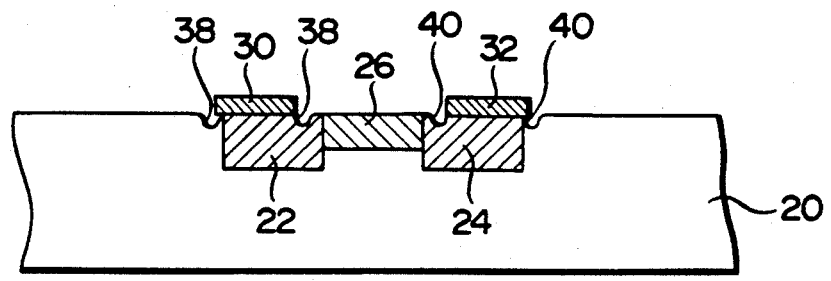

During the above-mentioned alloying process it often happens that, as shown in FIG. 3B, a groove 38 is formed in the surface of the source region 22 and substrate 20 around the periphery of the source electrode 30, and a groove 40 is formed in the surface of the drain region 24 and substrate 20.

Thereafter, a $SiO_2$ layer is deposited on the substrate 20 and the source, drain and channel regions 22, 24, 26 with a thickness of 10,000 Å by the CVD process in an atmosphere of monosilane ($SiH_4$) gas. The $SiO_2$ layer is selectively exposed with the resist pattern formed on said $SiO_2$ layer used as a mask. Later, a titanium (Ti) layer and aluminium (Al) layer are formed by vacuum deposition with respective thicknesses of 3,000 Å and 10,000 Å in the order mentioned on the resist pattern and the exposed portions of the $SiO_2$ layer. When the resist pattern is dissolved by an organic solvent, the Ti and Al layers on the resist pattern are removed from the $SiO_2$ layer, thereby providing the bonding pads 34, 36 and gate electrode 32 as shown in FIG. 2. After the formation of the bonding pads 34, 36 and gate electrode 32 of FIG. 2 by the so-called lift-off process, the unnecessary $SiO_2$ layer is etched off by a solution of ammonium fluoride ($NH_4F$). Last, an insulation layer (not shown) is deposited on the substrate surface except for those portions of the substrate surface on which the source and drain bonding pads 34, 36 and a gate bonding pad (not shown) are formed. The aforementioned grooves 38, 40 tend to be increased in size after the formation of the bonding pads 34, 36 and electrode 32.

FIGS. 4A and 4B are bar graphs showing the characteristics of the saturation drain current IDSS of the GaAs SB FET embodying this invention and that of the conventional GaAs SB FET and the yields of both products. In the test related to FIGS. 4A and 4B, a large number of GaAs SB FETs formed on one lot of 20 GaAs wafers were used as test pieces. As seen from FIGS. 4A and 4B the GaAs SB FET embodying this invention indicates fewer distribution in the saturated drain property and a more stable quality than the conventional product.

FIG. 5 shows a relationship between the noise factor NF in the range of 1 GHz frequency and a distance LS extending from the boundary between the channel region 26 and source region 22 to that side of the source electrode 30 which faces said boundary. With the test pieces of GaAS SB FET of this invention, the average value of the noise factor NF falls to a minimum level in the case of LS=2.5 microns. Conversely, in the case of LS<2 microns and LS>5 microns, the average value of the noise factor NF increases. In the case of LS<2 microns, the difference in the noise factor NF between the SB FETs increases.

With the embodiment of this invention, the drain electrode 32, as well as the source electrode 30, is separated from the channel region 26. Therefore, the surface of that portion of the channel region 26 which lies close to the drain region 24 is saved from erosion. Thus, the GaAs SB FET embodying this invention has about a 50% higher withstand voltage between the source and drain regions than the conventional product.

With the present mass production line for manufacturing the subject GaAs SB FET, masking for the formation of the source and drain electrodes 30, 32 on the source and drain regions 22, 24 can be effected with an error of about 2 microns at most. With the above-mentioned embodiment, a resist pattern defines those positions set about 2.5 microns from the channel region where the source and drain electrodes 20, 32 are to be formed on corresponding source and drains 22, 24 in order to attain the above-mentioned object. In the actual manufacturing of the subject field effect transistor, the source and drain electrodes 30, 32 may be displaced toward, for example, the channel region 26. However, the surface of the channel region 26 can be fully prevented from being eroded along the periphery of the source and drain electrodes 30, 32. In other words, the subject GaAS SB FET can be reliably manufactured on the present mass production line.

According to the present invention, the source and drain electrodes 30, 32 are formed apart from the channel region 26. Therefore, the erosion of the substrate surface, which tends to occur during the formation of the source and drain electrodes 30, 32, is prevented from being extended to the channel region containing a low concentration of an impurity. A groove is actually formed by erosion in the source and drain regions or semiinsulator substrate. Since, however, the source and drain regions contain a higher concentration of an impurity and also have a greater depth than the channel region, the property of the subject GaAs SB FET can be prevented from being noticeably deteriorated as in the case where the above-mentioned erosion groove is formed in the channel region.

As mentioned above, the present invention enables the present mass production line to manufacture with a good yield a high quality GaAS SB FET which has a more improved withstand voltage and a more stable property (particularly the saturated drain current property).

What is claimed is:

1. A field effect transistor comprising:
   a semiinsulator substrate of gallium arsenide;
   source and drain regions formed in a surface of said semiinsulator substrate and having a first concentration of an impurity;
   a channel region formed between and in contact with said source and drain regions in the surface of said semiinsulator substrate and having a second concentration of the impurity lower than said first impurity concentration;
   a gate electrode formed on and in Schottky contact with said channel region; and
   source and drain electrodes of gold-germanium alloy which are respectively formed on and alloyed with said source and drain regions to form alloy contacts of gold-germanium and gallium arsenide and which are displaced away from said channel region;
   wherein the distance between at least one of said source and drain electrodes and said channel region is set within a limited range required for reliably positioning the alloy contact outside said channel region to suppress an increase in the resistance between said at least one electrode and said gate electrode caused by erosion of said alloy contact, and for allowing the suppressed increase in the resistance to be substantially maintained.

2. A field effect transistor according to claim 1, wherein said limited range is from 2 to 5 microns.

3. A field effect transistor according to claim 2, further comprising first and second platinum layers formed on said source and drain electrodes.

4. A field effect transistor according to claim 1, further comprising first and second platinum layers formed on said source and drain electrodes.

* * * * *